United States Patent [19]

Xu et al.

[11] Patent Number: 5,902,461
[45] Date of Patent: May 11, 1999

[54] APPARATUS AND METHOD FOR ENHANCING UNIFORMITY OF A METAL FILM FORMED ON A SUBSTRATE WITH THE AID OF AN INDUCTIVELY COUPLED PLASMA

[75] Inventors: Zheng Xu, Foster City; Ralf Hofmann, San Jose, both of Calif.

[73] Assignee: Applied Materials, Inc., Santa Clara, Calif.

[21] Appl. No.: 08/922,893

[22] Filed: Sep. 3, 1997

[51] Int. Cl.$^6$ .................................................. C23C 14/34
[52] U.S. Cl. ............................ 204/192.12; 204/298.06; 204/298.08; 204/298.16
[58] Field of Search ....................... 204/192.12, 298.06, 204/298.08, 298.16, 298.17, 298.19

[56] References Cited

U.S. PATENT DOCUMENTS

| 3,594,295 | 7/1971 | Meckel et al. | 204/298.08 |
|---|---|---|---|
| 3,669,860 | 6/1972 | Knowles et al. | 204/298.16 |
| 4,336,118 | 6/1982 | Patten et al. | 204/192.12 |
| 4,626,312 | 12/1986 | Tracy | 156/345 |
| 4,661,228 | 4/1987 | Mintz | 204/192.25 |
| 4,871,421 | 10/1989 | Ogle et al. | 435/710 |
| 4,941,915 | 7/1990 | Matsuoka et al. | 204/298.12 |
| 4,999,096 | 3/1991 | Nihei et al. | 204/192.3 |
| 5,178,739 | 1/1993 | Barnes et al. | 204/192.12 |
| 5,186,718 | 2/1993 | Tepman | 29/25.01 |
| 5,330,628 | 7/1994 | Demaray | 204/192.12 |
| 5,430,355 | 7/1995 | Paranjpe | 315/111.21 |
| 5,443,995 | 8/1995 | Nulman | 438/654 |
| 5,496,455 | 3/1996 | Dill et al. | 204/298.19 |
| 5,503,676 | 4/1996 | Shufflebotham et al. | 118/723 MR |
| 5,573,595 | 11/1996 | Dible | 118/723 MP |
| 5,593,551 | 1/1997 | Lai | 204/298.19 |

FOREIGN PATENT DOCUMENTS

| 0607797 | 1/1994 | European Pat. Off. . |
|---|---|---|
| 59-190363 | 10/1984 | Japan . |

OTHER PUBLICATIONS

Cheng, et al., "Directional . . . Sputtering" J.VacSci.Technol. B13(2), Mar./Apr. 1995.

*Primary Examiner*—Nam Nguyen
*Assistant Examiner*—Rodney G. McDonald
*Attorney, Agent, or Firm*—William K. Konrad

[57] ABSTRACT

An apparatus and method for sputtering ionized material onto a substrate with the aid of an inductively coupled plasma which ionizes the material, which apparatus includes: a support member having a support surface for supporting a substrate; a target constituting a source of sputtering material; a coil for generating a plasma which is inductively coupled to the coil and which ionizes material sputtered from the target; and components for placing the support member at a potential which causes ionized material to be attracted to the support member. Magnets are provided to generate a magnetic field which is defined by magnetic field lines that lie in planes substantially perpendicular to the support surface and which have a constant polarity around the support surface.

39 Claims, 2 Drawing Sheets

APPARATUS AND METHOD FOR ENHANCING UNIFORMITY OF A METAL FILM FORMED ON A SUBSTRATE WITH THE AID OF AN INDUCTIVELY COUPLED PLASMA

BACKGROUND OF THE INVENTION

The present invention relates to plasma generators, and more particularly to methods and apparatus for generating a plasma to sputter deposit a film, or layer, of material on workpieces, or substrates, such as semiconductor wafers, in the fabrication of semiconductor devices.

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process in a process chamber, a plasma is produced in the vicinity of a sputter target material which is negatively biased. Ions created adjacent the target impact the surface of the target to dislodge, i.e., "sputter", atoms of the material from the target. The sputtered material is then at least partially ionized in the plasma, and deposited on the surface of the semiconductor wafer.

Ionization of the sputtered material is often desirable because nonionized sputtered material has a tendency to travel in straight line paths from the target to the substrate being deposited, at angles which are oblique to the surface of the substrate. As a consequence, materials deposited in etched openings including trenches and holes of semiconductor devices having openings with a high depth to width aspect ratio, may not adequately coat the walls of the openings, particularly the bottom walls. If a large amount of material is being deposited, the deposited material can bridge over, causing undesirable cavities in the deposition layer.

To prevent such cavities, sputtered material can be redirected into substantially vertical paths between the target and the substrate by negatively biasing (or self biasing) the substrate and positioning appropriate vertically oriented electric fields adjacent the substrate if the sputtered material is sufficiently ionized by the plasma. However, material sputtered in a low density plasma often has an ionization degree of less than 10% which is usually insufficient to avoid the formation of an excessive number of cavities. Accordingly, it is desirable to increase the density of the plasma in order to increase the ionization rate of the sputtered material and decrease the formation of unwanted cavities in the deposition layer. As used herein, the term "dense plasma" is intended to refer to one that has a high electron and ion density, in the range of $10^{11}$–$10^{13}$ ions/cm$^3$.

There are several known techniques for exciting a plasma with RF fields, these techniques including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As,shown in U.S. Pat. No. 4,362,632, for example, current through a coil is supplied by an RF generator coupled to the coil through an impedance matching network, such that the coil acts as the primary winding of a transformer. The plasma acts as a single turn secondary winding of the transformer.

Although ionizing the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniformity of deposition thickness is needed.

In addition, in at least certain types of plasma generators, the plasma density has been observed to vary around the vertical axis of the coil, producing a corresponding variation in the thickness of a deposited film. This variation is such that the film has maximum and minimum values at opposite ends of a line which intersects the coil axis.

BRIEF SUMMARY OF THE INVENTION

It is a primary object of the present invention to improve the uniformity of such deposited layers.

Another object of the invention is to achieve an improved thickness uniformity across the surface of a substrate in a structurally simple manner.

A further object of the invention is to eliminate, or at least substantially reduce, variations in the thickness of a deposited layer about the center axis of the substrate support surface.

The above and other objects are achieved, according to the present invention, in an apparatus for sputtering ionized material onto a substrate with the aid of an inductively coupled plasma which ionizes the material, which apparatus includes a plurality of magnets positioned to provide a magnetic field above a workpiece support in which substantially all of the magnetic field lines defining the field are oriented toward the workpiece support. In a preferred embodiment, all the magnetic field lines lie in planes substantially perpendicular to the support surface and have a constant polarity around the support surface. As explained in greater detail below, it is believed that such a magnetic field can advantageously improve plasma density uniformity and uniformity of deposition as well.

In another aspect of the present invention, the magnetic field may be distributed asymmetrically to produce a magnetic field which is asymmetric about the central axis of the plasma producing coil of the chamber. It is believed that such asymmetries can at least partially offset asymmetric distributions of the plasma density about that axis.

DETAILED DESCRIPTION OF THE INVENTION

Figure 1:
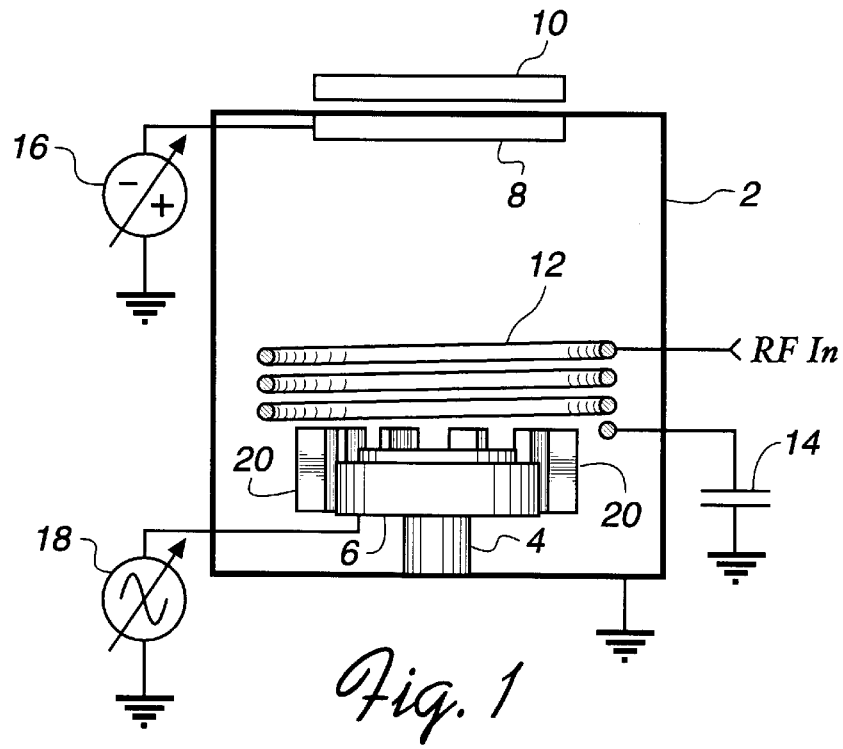
FIG. 1 is a simplified side elevational view illustrating a plasma generating apparatus according to the invention.

FIG. 1 illustrates the basic components of an installation for processing workplaces in the presence of an inductively coupled plasma. These components include a processing chamber 2 containing a substrate support 4 supporting a substrate 6, a sputtering target 8, a magnet assembly, or magnetron, 10 providing a magnetic field that promotes the sputtering of material from target 8, and a coil 12 which generates an RF magnetic field required to ignite and maintain a plasma.

As is known in the art, a plasma can be generated in chamber 2 when a processing gas, such as argon, at a sufficient pressure (20 mTorr, for example) is subjected to an appropriate RF magnetic field produced by coil 12 to ionize the gas.

RF current is supplied to coil 2 from an RF power source (not shown) via an appropriate matching network (not shown), all of which may be conventional in the art. The power source is connected to one end of coil 12, while the other end thereof is connected to ground via a dc blocking capacitor 14.

Target 8 is generally made of a metal, such as titanium, which is to be sputtered in order to be deposited as a layer on substrate 6. Substrate support 4 and target 8 are normaly biased to negative potentials by means of DC and AC voltage sources 16 and 18, respectively. Chamber 2 includes, or is constituted by, a conductive shield maintained at ground potential. Substrate 6 may typically be constituted by one or a plurality of semiconductor wafers, panels or other workpieces.

The magnetic field produced by magnetic assembly 10 creates a magnetic tunnel adjacent to the target face, within which electrons will be trapped. These electrons collide with gas atoms, creating ions of the gas atoms which are then attracted to the surface of target 8. These ions thus bombard target 8 to dislodge atoms of the metal therefrom. At least a portion of these atoms are ionized in the plasma and the resulting metal ions, having a positive polarity, are attracted to substrate 6 under the influence of the negative bias potential on substrate 6.

In an installation having the components described thus far, the magnetic field produced by coil 12 decreases progressively in horizontal radial directions from a maximum value along the vertical center axis of coil 12, which generally corresponds to the vertical center axis of chamber 2. The plasma density undergoes a corresponding decrease. As a result, a fraction of the ions of sputtered target material which travel through the peripheral region of the plasma, and which generally originate at the peripheral region of target 8, are deflected radially outward and thus do not reach the surface of substrate 6. It is believed that this is one significant cause of the radial variation in deposited layer thickness across the surface of substrate 6.

According to the present invention, this tendency of sputtered material ions to move laterally outward may be counteracted by the provision of an array of magnets 20 distributed around support 4. These magnets may all be permanent magnets or electromagnets. According to a particular feature of the present invention, all of magnets 20 are oriented to have the same, constant, magnetic polarity.

Magnets 20 produce magnetic field lines which extend essentially along planes that are perpendicular to the substrate support surface of support 4 and have the effect of confining the peripheral portion of the plasma so that a higher proportion of ions of sputtered material are delivered to the peripheral region of substrate 6.

It has been found that the improvement offered by the illustrated embodiment of the present invention is dependent on the polarity with which magnets 20 are oriented. Specifically, when the bias potentials applied to target 8 and support 4 are negative with respect to ground, the north pole of each magnet 20 should preferably be directed upwardly, i.e. toward target 8.

Figure 2:
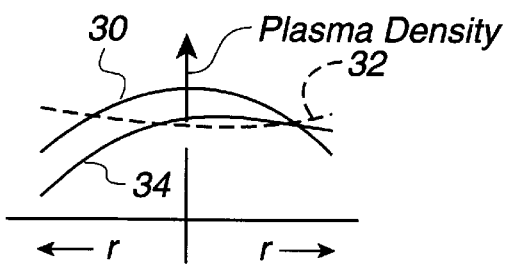
FIG. 2 is a graph schematically depicting the magnitude of axial magnetic field strength in the apparatus of FIG. 1, with and without components according to the present invention.

The effect of magnets 20 on plasma density, and hence on uniformity of deposition of sputtered material, is illustrated in FIG. 2 which shows a coordinate system in which the ordinate represents plasma density and the abscissa represents the horizontal dimension of the substrate support surface of support 4, the horizontal dimension being measured from the vertical center axis of the plasma field.

Curve 30 represents a typical plasma density distribution in previous apparatus of the type shown in FIG. 1, with magnets 20 not being present. The plasma density has a maximum value along the center axis of coil 12.

Curve 32, shown in broken lines, represents an exemplary plasma density distribution which it is believed can be achieved when magnets 20 according to the invention are provided. The exemplary curve 32 is shown to have a slight upward curvature only in order to indicate that it is believed that practical embodiments of the invention can achieve a significant improvement in plasma density uniformity but may, under practical conditions, still produce some nonuniformity. It should be readily apparent, however, that a careful selection of the magnetic field strength, positioning and number of magnets 20 can produce a plasma density represented by a curve which closely approximates a straight, horizontal line, In accordance with a further feature of the invention, magnets 20 can be distributed nonuniformly around the periphery of the wafer support surface of support 4 in order to counteract angular variations in plasma density, i.e. variations about the vertical center axis of the plasma field, which corresponds to the vertical central axis of coil 12. Such angular variations in plasma density can be created when certain varieties of plasma generating coils are employed. In particular, this occurs when the plasma generating coil has a single turn. A typical plasma density variation in this case along one vertical plane containing the vertical axis of the plasma field is represented by curve 34 in FIG. 2.

Figure 3:
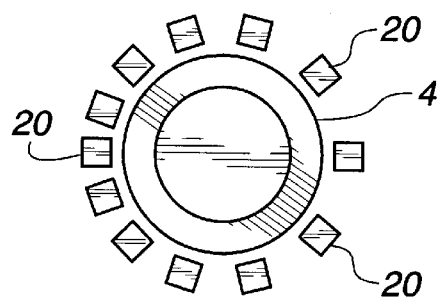
FIG. 3 is a plan view illustrating a preferred embodiment of the invention.

In order to counteract such an angular variation, magnets 20 may be distributed around the periphery of substrate support 4 in the manner shown in FIG. 3. As is there illustrated, the spacing between successive ones of magnets 20 varies progressively from a minimum value at the left-hand side of support 4 to a maximum value at the right-hand side thereof. Magnets 20 are closest together in the region where, in the absence of magnets 20, the plasma density would have a minimum value.

In accordance with another aspect of the present invention, angular variations in plasma density can be counteracted by giving certain ones of magnets 20 field strengths which differ from those of others of magnets 20. Specifically, the strength of each magnet could have an inverse relationship to the plasma density in the angular region where that magnet is located. In other words, in the region of maximum plasma density, a magnet or magnets having minimum field strength would be provided, while in a region of minimum plasma density, a magnet or magnets having a maximum field strength would be provided. If desired, the field strengths of the magnets can change progressively from one magnet to the next. However, it is also possible for several successive magnets to have identical field strengths. As a general guideline for one embodiment, the pattern of variation of magnetic field strength from magnet to another may be selected on the basis of the pattern of angular variation in plasma density about the center axis of the plasma field.

In accordance with yet another aspect of the invention, magnets 20 can both be distributed nonuniformly around the periphery of the wafer support surface of support 4 and can have different field strengths, depending upon the particular application. With respect to the embodiment shown in FIG. 3, it will be understood that the number of magnets employed, the strength of the magnets and the precise spacing between adjacent magnets to achieve an optimum improvement can be readily determined on the basis of the characteristics of a particular installation. With respect to embodiments in which the field strength of one or more magnets differ from the field strength of other magnets, the precise field strength values will also be determined on the basis of the characteristics of the particular installation.

The position of magnets 12 in the vertical direction will usually be selected so that their north poles are above substrate 6 and their south poles will be below substrate 6. However, in certain types of apparatus, it may be found that optimum results may be achieved by raising or lowering magnets 20.

Figure 4:
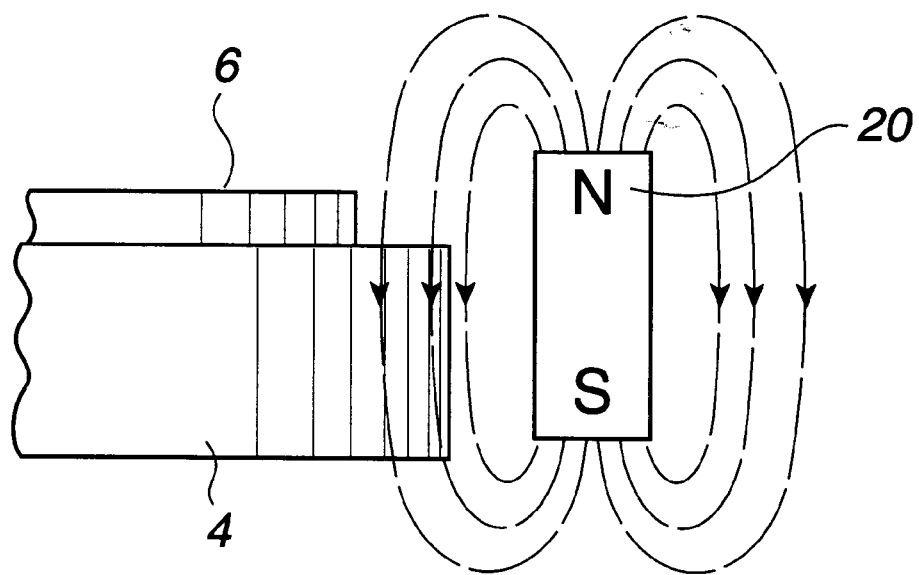
FIG. 4 is a detail view showing one of the components according to the present invention.

FIG. 4 is a detail view illustrating an operating principle in accordance with one aspect of the present invention. FIG. 4 illustrates representative magnetic field lines produced by a magnet 20, each of these lines lying in a vertical plane. In the region of the edge of substrate support 4, the magnetic fields produced by magnets 20 will tend to deflect electrons radially inward toward the center of substrate 6. Due to the effects of ambipolar diffusion, which exists in an inductively coupled plasma, the ions of sputtered material will tend to follow the motion of the electrons. Hence, the ionized sputtered atoms in the annular shaped region between the magnets 20 and the substrate 6 will tend to deflect radially inward as well. Consequently, material which might otherwise have deposited onto the walls of the chamber 2 or the outer perimeter of the substrate support or clamp may now be deflected inward sufficiently to deposit onto the peripheral area of the substrate 6. Because the center of the substrate 6 is farther from the magnet array 20 than the periphery of the substrate 6, it is believed that the overall net effect of deflecting at least a portion of the ionized sputtered material radially inward will be to increase the amount of ionized deposition material deposited onto the peripheral areas of the substrate 6 relative to any increase of material deposited in the central regions of the substrate 6. As a result, it is believed that the center thick deposition profile typical of many high density plasma sputter deposition apparatus may be offset in whole or in part by providing a radially inward ion deflecting magnetic field in accordance with the present invention.

Figure 5:
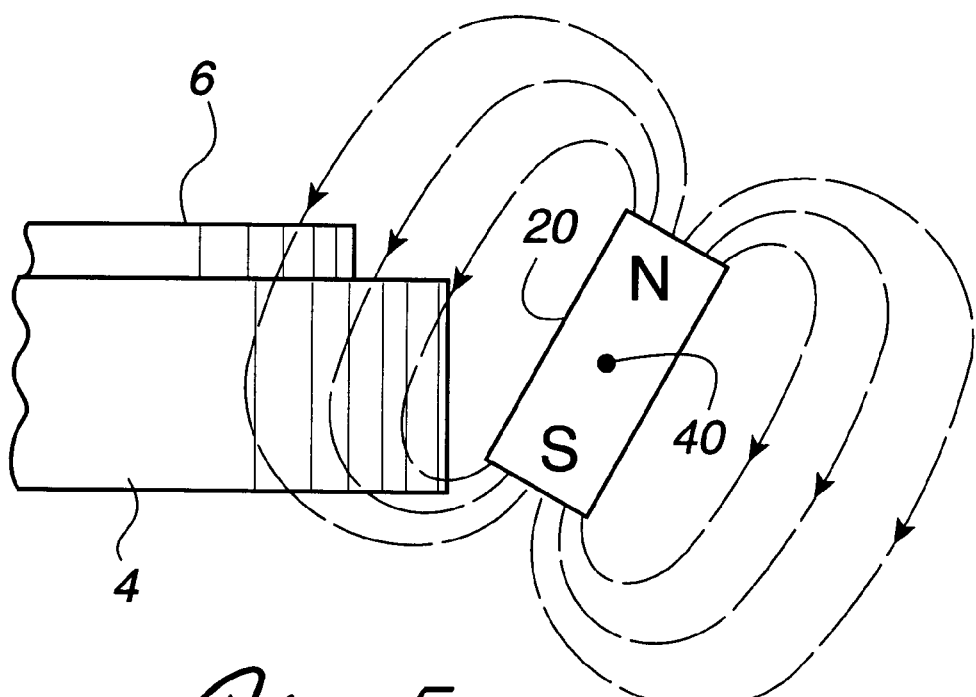
FIG. 5 is a detail view similar to that of FIG. 4 illustrating another embodiment of the invention.

According to another embodiment of the invention, one or more of magnets 20 may be tilted, as shown in FIG. 5, about an axis 40 which lies on a circle that is coaxial with the central axis of coil 12, which generally corresponds to the vertical central axis of chamber 2. In this case, the magnetic field lines produced by magnet 20 will intersect the surface of substrate 6 at acute angles, whereas the magnetic field lines produced by magnet 20 having the orientation shown in FIG. 4 will be substantially perpendicular to the surface of substrate 6 at the location where they intersect that surface.

It is believed the a, for certain apparatus configurations, positioning of magnets 20 to have the orientation shown in FIG. 5 can serve to optimize the effect to be produced by magnets 20. The precise value of the angle between the magnetic axis of each magnet 20 and the vertical center axis of the plasma field to produce an optimum result can be determined in a straight forward manner by observing the deposition result produced in that apparatus with different inclination values. Here, the magnetic axis of a magnet is defined as the line between the center of the north pole and the center of the south pole of the magnet.

In further accordance with the invention, the magnetic axes of individual magnets can be placed at respectively different tilt angles to compensate for the effects of angular variations in the plasma field. Thus, one or more of magnets 20 can be oriented so that their magnetic axes extend parallel to the vertical center axis of the plasma field, while one or more of magnets 20 is tilted so that its vertical axis forms an acute angle with the vertical center axis of the plasma field. With respect to those magnets 20 whose magnetic axes are so tilted, the tilt angle can vary from one magnet to another. In all cases, however, it is preferred that the magnetic axis of each magnet 20 lie in a plane which also contains the vertical central axis of coil 12, i.e. each magnet 20 may be tilted in a radial direction, but preferably not in the circumferential direction.

Embodiments of the invention which have been described above include those in which the circumferential spacing between successive magnets 20 varies around the circumference of substrate support 4, those in which one or more of magnets 20 can have a field strength different from the field strength of other magnets and those in which one, several or all of magnets 20 are tilted, preferably in radial directions. However, embodiments of the present invention can also have any combination of these features.

It will thus be seen that by the provision of a plurality of magnets within chamber 2, the uniformity with which a layer of sputtered material is formed on a substrate can be substantially improved.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. An apparatus for sputtering material onto a workpiece, the apparatus comprising:

a vacuum chamber enclosing a plasma generation area;

a target constituting a source of material to be sputtered and having a bias to attract ions;

a workpiece support for supporting a workpiece;

an RF coil positioned to inductively couple RF energy into a plasma to ionize said sputtered deposition material; and a plurality of magnets positioned within said vacuum chamber and adjacent to said workpiece support to provide a magnetic field adjacent to said workpiece support in a region between said workpiece support and said target, which field is defined by magnetic field lines in which substantially all of said magnetic field lines extending in said region between said workpiece support and said target are oriented toward said workpiece support.

2. In an apparatus for sputtering ionized material onto a substrate with the aid of an inductively coupled plasma which ionizes the material, which apparatus includes: a support member having a support surface for supporting a substrate; a target constituting a source of sputtering material; a coil for generating a plasma which is inductively coupled to the coil and which ionizes material sputtered from the target; the improvement comprising magnetic field generating means disposed around said support surface for generating a magnetic field having a constant polarity around and adjacent to said support surface and oriented to deflect ionized sputtered material inward toward said support.

3. In an apparatus for sputtering ionized material onto a substrate with the aid of an inductively coupled plasma which ionizes the material, which apparatus includes: a support member having a support surface for supporting a substrate; a target constituting a source of sputtering material; plasma generating means including a coil for generating a plasma which is inductively coupled to the coil and which ionizes material sputtered from the target; and means for placing the support member at a potential which causes ionized material to be attracted to the support member, the improvement comprising magnetic field generating means disposed around and adjacent to said support surface for generating a magnetic field which is defined by magnetic field lines that lie in planes substantially perpendicular to said support surface and which have a constant polarity around said support surface.

4. The apparatus according to claim 3 wherein said support member has a periphery and said magnetic field generating means comprise a plurality of magnets spaced apart around said periphery.

5. The apparatus according to claim 4 wherein each of said magnets has two ends which are spaced apart in the direction between said target and said support member.

6. The apparatus according to claim 5 wherein one end of each magnet faces toward said target and is a north magnetic pole, and the potential of said support member induces a negative electrical polarity on a workpiece.

7. The apparatus according to claim 6 wherein said plurality of magnets comprise a plurality of bar magnets.

8. The apparatus according to claim 7 wherein said plurality of magnets are distributed uniformly around the periphery of said support member.

9. The apparatus according to claim 7 wherein said support member has a central axis, the plasma generated by said plasma generating means has a plasma density distribution which is asymmetric with respect to the central axis, and said magnets are distributed asymmetrically around the periphery of said support member in a manner such that the magnetic field produced by said magnetic field generating means is asymmetric about the central axis in a manner which at least partially counteracts the asymmetric distribution of the plasma density.

10. The apparatus according to claim 9 wherein said coil is a single turn coil having two coil ends and said magnets have a minimum spacing at a location aligned with said coil ends.

11. The apparatus according to claim 10 wherein said magnetic field is configured to guide ionized material parallel to the magnetic field lines in a direction having a component toward a center of said support surface.

12. The apparatus according to claim 3 further comprising a processing chamber in which said support member, said target, said coil and said magnetic field generating means are disposed, and wherein said coil is a single turn coil.

13. A method of sputtering ionized material onto a substrate, comprising:
sputtering deposition material from a target;
ionizing said sputtered material using a plasma generated by an inductively coupled coil;
deflecting a portion of said ionized sputtered material inwardly toward a workpiece support using magnetic fields arrayed around and adjacent to said support and oriented toward said support and having a constant polarity; and
depositing a portion of said deflected ionized deposition material onto a substrate.

14. The method according to claim 13 wherein said support member has a periphery and said magnetic fields are provided by a plurality of magnets positioned adjacent to said periphery.

15. The method according to claim 14 wherein each of said magnets has two ends which are spaced apart in the direction between said target and said support member.

16. The method according to claim 15 wherein one end of each magnet faces toward said target and is a north magnetic pole, and the other end of each magnet is a south magnetic pole and said support member has a workpiece support surface aligned between said north and south poles of said magnets.

17. The method according to claim 14 wherein said plurality of magnets comprise a plurality of bar magnets.

18. The method according to claim 17 wherein said plurality of magnets are distributed symmetrically around the periphery of said support member.

19. The method according to claim 14 wherein said support member has a central axis, the plasma has a plasma density distribution which is asymmetric with respect to the central axis, and said magnets are distributed asymmetrically around the periphery of said support member so that the magnetic field produced by said magnets is asymmetric about the central axis to least partially counteract the asymmetric distribution of the plasma density.

20. The method according to claim 19 wherein said coil is a single turn coil having two coil ends and said magnets have a minimum spacing at a location aligned with said coil ends.

21. In a method of sputtering ionized material onto a substrate with the aid of an inductively coupled plasma which ionizes the material, the method being performed by apparatus which includes: a support member having a support surface for supporting a substrate; a target constituting a source of sputtering material; a coil for generating a plasma which is inductively coupled to the coil and which ionizes material sputtered from the target; the improvement comprising generating a magnetic field having a constant north polarity around said support surface and oriented in planes perpendicular to said support and adjacent to surface to deflect ionized sputtered material inward toward said support and to deposit said deflected ionized sputtered material onto said substrate.

22. In a method for sputtering ionized material onto a substrate with the aid of an inductively coupled plasma which ionizes the material, the method being performed with apparatus which includes: a support member having a support surface for supporting a substrate; a target constituting a source of sputtering material; plasma generating means including a coil for generating a plasma which is inductively coupled to the coil and which ionizes material sputtered from the target; and means for placing the support member at a potential which causes ionized material to be attracted to the support member, the improvement comprising generating a magnetic field around and adjacent to said support member, said field being defined by magnetic field lines that lie in planes substantially perpendicular to the support surface and which have a constant polarity around the support surface.

23. The method according to claim 22 wherein the support member has a periphery and the magnetic field is generated by a plurality of magnets spaced apart around the periphery.

24. The method according to claim 23 wherein each of the magnets has two ends which are spaced apart in the direction between the target and the support member.

25. The method according to claim 24 wherein one end of each magnet faces toward the target and is a north magnetic pole, and the potential of the said support member has a negative electrical polarity.

26. The method according to claim 25 wherein the plurality of magnets comprise a plurality of bar magnets.

27. The method according to claim 26 wherein the plurality of magnets are distributed uniformly around the periphery of the support member.

28. The method according to claim 22 wherein the support member has a central axis, the plasma generated by the plasma generating means has a plasma density distribution which is asymmetric with respect to the central axis, and said step of generating a magnetic field is carried by distributing magnets asymmetrically around the periphery of the support member in a manner such that the generated magnetic field has an asymmetric field strength about the central axis in a manner which at least partially counteracts the asymmetric distribution of the plasma density.

29. The method according to claim 28 wherein the coil is a single turn coil having two coil ends and the magnets have a minimum spacing at a location aligned with the coil ends.

30. The method according to claim 22 wherein the magnetic field is configured to guide ionized material parallel to the magnetic field lines in a direction having a component toward a center of the support surface.

31. An apparatus for sputtering material onto a workpiece, the apparatus comprising:

a vacuum chamber enclosing a plasma generation area;

a target constituting a source of material to be sputtered and having a bias to attract ions;

a workpiece support for supporting a workpiece;

an RF coil positioned to inductively couple RF energy into a plasma to ionize said sputtered deposition material; and a plurality of magnets positioned to provide a magnetic field adjacent to said workpiece support in a region between said workpiece support and said target, which field has a constant polarity around and adjacent to said support surface and oriented to deflect ionized sputtered material inward toward said support.

32. The apparatus according to claim 31 wherein said support member has a periphery and said plurality of magnets are positioned adjacent to said periphery.

33. The apparatus according to claim 32 wherein each of said magnets has two ends which are spaced apart in the direction between said target and said support member.

34. The apparatus according to claim 33 wherein one end of each magnet faces toward said target and is a north magnetic pole, and the other end of each magnet is a south magnetic pole and said support member has a workpiece support surface aligned between said north and south poles of said magnets.

35. The apparatus according to claim 31 wherein said plurality of magnets comprise a plurality of bar magnets.

36. The apparatus according to claim 35 wherein said plurality of magnets are distributed symmetrically around the periphery of said support member.

37. The apparatus according to claim 31 wherein said support member has a central axis, the plasma has a plasma density distribution which is asymmetric with respect to the central axis, and said magnets are distributed asymmetrically around the periphery of said support member so that the magnetic field produced by said magnets is asymmetric about the central axis to least partially counteract the asymmetric distribution of the plasma density.

38. The apparatus according to claim 37 wherein said coil is a single turn coil having two coil ends and said magnets have a minimum spacing at a location aligned with said coil ends.

39. A method of sputtering ionized material onto a substrate in a vacuum chamber, comprising:

sputtering deposition material from a target;

ionizing said sputtered material using a plasma generated by an inductively coupled coil;

deflecting a portion of said ionized sputtered material inwardly toward a workpiece support using a plurality of magnets positioned within said vacuum chamber and adjacent to said workpiece support to provide a magnetic field oriented toward and adjacent to said workpiece support in a region between said workpiece support and said target; and depositing a portion of said deflected ionized deposition material onto a substrate.

* * * * *